(12) United States Patent
Liu

(10) Patent No.: US 7,285,853 B2
(45) Date of Patent: Oct. 23, 2007

(54) MULTILAYER ANTI-REFLECTIVE COATING FOR SEMICONDUCTOR LITHOGRAPHY AND THE METHOD FOR FORMING THE SAME

(75) Inventor: Chung-Shi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 176 days.

(21) Appl. No.: 11/059,842

(22) Filed: Feb. 17, 2005

(65) Prior Publication Data
US 2006/0183346 A1 Aug. 17, 2006

(51) Int. Cl.
*H01L 23/48* (2006.01)
(52) U.S. Cl. ............... 257/734; 257/E21.575
(58) Field of Classification Search ........ 428/250; 257/306, 357
See application file for complete search history.

(56) References Cited

U.S. PATENT DOCUMENTS

| | | | |
|---|---|---|---|
| 5,130,400 A * | 7/1992 | Pachaly | 528/21 |
| 6,100,559 A | 8/2000 | Park | 257/315 |
| 6,664,177 B1 | 12/2003 | Lin et al. | 438/624 |
| 6,686,272 B1 | 2/2004 | Lee et al. | 438/636 |
| 7,034,409 B2 * | 4/2006 | Xu et al. | 257/632 |
| 2004/0023497 A1 | 2/2004 | Pan et al. | 438/694 |
| 2004/0152256 A1 * | 8/2004 | Noguchi et al. | 438/250 |
| 2004/0214446 A1 * | 10/2004 | Kim et al. | 438/706 |
| 2006/0024954 A1 * | 2/2006 | Wu et al. | 438/629 |

* cited by examiner

*Primary Examiner*—Scott B. Geyer
*Assistant Examiner*—Elias Ullah
(74) *Attorney, Agent, or Firm*—Thomas, Kayden, Horstemeyer & Risley

(57) ABSTRACT

An interconnect structure has a dielectric layer having a dielectric constant less than 3.9 overlying a substrate with a conductive region, a silicon oxycarbide layer overlying the dielectric layer, and a silicon oxynitride layer overlying the silicon oxycarbide layer. A conductive layer is inlaid the silicon oxynitride layer, the silicon oxycarbide layer and the dielectric layer to electrically connect to the conductive region.

7 Claims, 3 Drawing Sheets

MULTILAYER ANTI-REFLECTIVE COATING FOR SEMICONDUCTOR LITHOGRAPHY AND THE METHOD FOR FORMING THE SAME

FIELD OF THE INVENTION

This invention generally relates to photolithographic patterning of semiconductor features, and more particularly to a method for forming damascene structures having anti-reflective coating (ARC) layers.

BACKGROUND

In a common application for integrated circuit fabrication, a contact/via opining is etched through an insulating layer to an underlying conductive area to which electrical contact is to be made. A conducting layer material is deposited within the contact/via opening. The damascene and dual damascene processes have become a trend in metallization. Trenches and/or vias are formed in the insulating layers and inlaid with metal, such as copper, to contact with the underlying conductive area. It is desired to use low dielectric constant (low k) materials in order to reduce capacitance of the resulting devices.

It is a challenge to improve the photolithography processing window in damascene process by using ARC, anti-reflection coatings, to reduce reflectivity and improve light absorption, to minimized light scattering back from the underlying substrate. One solution is to use silicon nitride (SiN) or silicon oxynitride (SiON) to be ARC when using low-k materials in the intermetal dielectric layers (IMD). The nitride and oxynitride layers are frequently formed by CVD processes using chemicals such as amine and amide which tend to diffuse into adjacent porous layers of dielectric insulating layers. For example, the increasing use of low-k dielectric materials, typically having a high degree of porosity, facilitates absorption and transport of contaminating chemical species.

Approaches to prevent the diffusion of contaminating nitrogen containing species from overlying etching stop or BARC layers including for example silicon oxynitride, include forming a silicon dioxide layer over the low dielectric constant IMD layer prior to forming the etching stop or BARC layers. A shortcoming of this approach is the added stresses applied to the IMD layer and the added contribution to the overall capacitance of the multi-level semiconductor device.

Another approach has been to use a carbon based BARC's, as the BARC thereby avoiding the presence of nitrogen contaminating species. A shortcoming of this approach is that a carbon based BARC during anisotropic etching contributes to the formation of polymer residues on the sidewalls and bottoms of the etched feature frequently slowing the etching rate within the feature, also referred to as etch stop phenomena.

The related Prior Art will now be described in this section.

U.S. PUB. APP. NO. US20040023497A1 entitled "Method for avoiding carbon and nitrogen contamination of a dielectric insulating layer" published Feb. 5, 2004 to Pan, Shing-Chyang et al. teaches method for preventing carbon and nitrogen penetration from a deposited overlayer into a dielectric insulating layer to improve a subsequent photo-lithographic patterning and anisotropic etching process.

U.S. Pat. No. 6,686,272 entitled "Anti-reflective coatings for use at 248 nm and 193 nm" granted Feb. 3, 2004 to Lee, et al. teaches method for forming a silicon carbide anti-reflective coating (ARC) and a silicon oxycarbide ARC, and a silicon oxycarbide ARC treated with oxygen plasma.

U.S. Pat. No. 6,100,559 entitled "Multipurpose Graded Silicon Oxynitride Cap Layer" granted Aug. 8, 2000 to Park teaches a photolithography process using a graded thin SiON layer, as an anti-reflective coating (ARC) and is graded with varying concentrations of nitrogen.

U.S. Pat. No. 6,664,177 entitled "Dielectric ARC scheme to improve photo window in dual damascene process" granted Dec. 16, 2003 to Lin, et al. teaches a multi-layered dual damascene process by using a dielectric anti-reflection coating, DARC, comprised of multiple layers of SiON with varying k, dielectric constant values and thickness, to reduce reflectivity and improve light absorption.

SUMMARY OF THE INVENTION

It is an object of the present invention to provide a multilayer anti-reflective coating (ARC) layers including a silicon nitride layer laminated thereto a silicon carbide layer.

It is another object of the present invention to provide a robust copper interconnect structure having anti-reflective coating (ARC) layers including a silicon nitride layer laminated thereto a silicon carbide layer.

It is another object of the present invention to provide a robust copper interconnect structure to reduce resist poisoning and prevent dielectric peeling.

It is another object of the present invention to provide a multilayer anti-reflective coating (ARC) layers over low k dielectric insulating layers to prevent the low k dielectric material from the absorption of contamination chemical species.

To achieve the above objectives, the present invention provides an interconnect structure comprising: a substrate comprising a conductive region; at least one dielectric layer having a dielectric constant less than 3.9 overlying the substrate; a silicon oxycarbide layer overlying the dielectric layer; a silicon oxynitride layer overlying the silicon oxycarbide layer; and a conductive layer inlaid the silicon oxynitride layer, the silicon oxycarbide layer and the dielectric layer, wherein the conductive layer is electrically connected to the conductive region.

To achieve the above objectives, the present invention provides a fabrication method of forming a semiconductor device, comprising the steps of: providing a semiconductor substrate; forming at least one dielectric layer; depositing a first anti-reflective coating (ARC) layer comprising silicon oxycarbide overlying the dielectric layer; depositing a second ARC layer comprising silicon oxynitride material overlying the first anti-reflective coating layer; and depositing a photoresist layer on the second anti-reflective coating layer.

To achieve the above objectives, the present invention provides a fabrication method of forming an interconnect structure, comprising the steps of: providing a substrate having a conductive region; forming at least one dielectric layer overlying the substrate; forming a silicon oxycarbide layer overlying the substrate; forming a silicon oxynitride layer overlying the silicon oxycarbide layer; forming at least one opening in the silicon oxycarbide layer, the silicon oxynitride layer, and the dielectric layer, to expose the conductive region; and filling the opening with a conductive layer.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF THE PREFERRED EMBODIMENTS

Figure 1A:
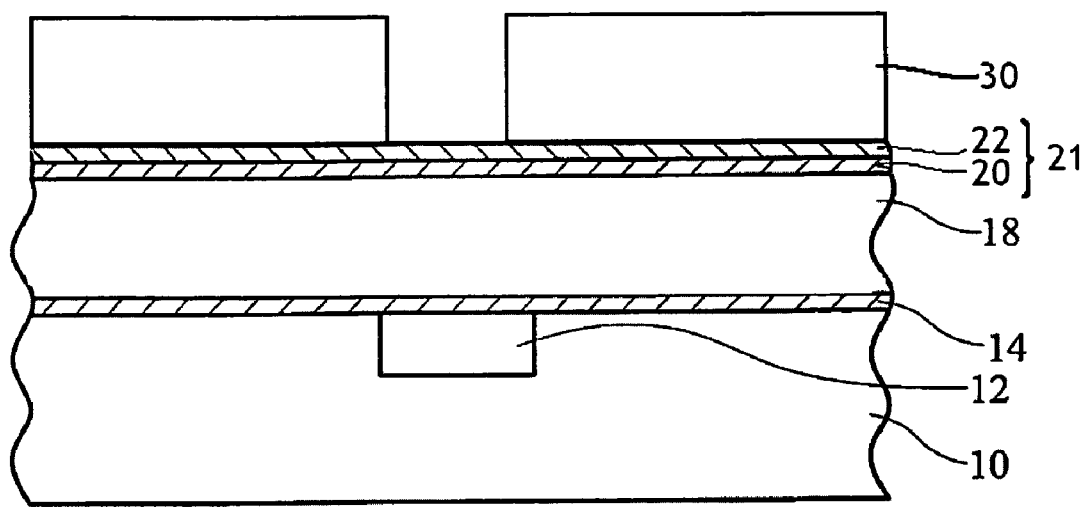
FIGS. 1A to 1D are cross-sectional diagrams illustrating a copper interconnection process according to one embodiment of the present invention.

The present invention provides metal, such as copper or copper alloy, interconnection patterns, particularly employing damascene techniques and low-k dielectric material, which employs a multilayer SiON/SiOC structure as an anti-reflective coating (ARC) layer on a low-k IMD layer to overcome the aforementioned problems of the prior art. The present invention addresses and solves problems impacting device reliability as feature sizes shrink into the deep sub-micron generation in an effort to satisfy the ever-increasing demands for miniaturization and high circuit speed. In attempting to fabricate a robust copper damascene integrated with low-k IMD layers, a SiON layer and a SiOC layer laminated thereon are used as a multilayer ARC structure to prevent the low k dielectric material from the absorption of contamination chemical species and the formation of the phenomenon of etching stop during anisotropic etching, and lower an effective k value in the overall stack dielectrics as well. As will be appreciated by persons skilled in the art from discussion herein, the present invention has wide applicability to many manufacturers, factories and industries, including but not limited to, integrated circuit fabrications, microelectronic fabrications, and optical electronic fabrications.

As used throughout this disclosure, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The term "dielectric" refers to a material in which an electric field can be maintained with zero or near-zero power dissipation, i.e., the electrical conductivity is zero or near zero. The term "low-k" refers to dielectric materials having a dielectric constant (k value) of less than about 3.9 for a dielectric material. The term "etch stop" refers to a layer which is deposited on or intermediately in a layer, and is of a different material than a layer overlying the etch stop, and preferably has characteristics which render its etch rate much slower than that of the material overlying it. The result is that the etch stop provides a clear indicator of when to end a particular etching process.

As will be described more fully later, damascene process provides amore exact dimensional control over small geometries, while copper, as the metallization material, provides greater electrical characteristics. The term "damascene" is derived from a manner of inlaid metal. In the context of integrated circuits it implies a patterned layer imbedded on and in another layer such that the top surfaces of the two layers are coplanar. Thus, in semiconductor manufacturing, trenches or/and vias in appropriate locations in the trenches are formed in an insulating material by etching, which are then filled with metal. The damascene process is repeated as many times as required to form the multi-level interconnections between metal lines and the vias formed there between. Although the preferred embodiments of the present invention illustrate copper interconnection patterns using single damascene process and dual damascene process, the present invention provides value when using non-damascene methods.

Hereinafter, reference will now be made in detail to the present preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be presented.

FIGS. 1A to 1D are cross-sectional diagrams illustrating a copper interconnection process according to embodiments of the present invention.

For example, in an exemplary embodiment, referring to FIGS. 1A-1D, are shown cross sectional side views of a portion of a multi-level semiconductor device at stages in manufacturing a dual damascene structure.

Referring to FIG. 1A, an example of a substrate 10 used for interconnection fabrication is illustrated. The substrate 10 may comprise a semiconductor substrate as employed in a semiconductor integrated circuit fabrication, and integrated circuits may be formed therein and/or thereupon. The term "semiconductor substrate" is defined to mean any construction comprising semiconductor material, including, but not limited to, bulk semiconductor materials such as a semiconductor wafer and semiconductor material layers. The term "integrated circuits" as used herein refers to electronic circuits having multiple individual circuit elements, such as transistors, diodes, resistors, capacitors, inductors, and other active and passive semiconductor devices. The substrate 10 comprises a conductive region 12, which has an exposed surface treated by a planarization process, such as chemical mechanical polishing (CMP). Suitable materials for the conductive region 12 may include, but not limited to, for example copper, aluminum, copper alloy, the combinations thereof, or other mobile conductive materials.

As depicted in FIG. 1A, a etch stop layer 14, a low-k dielectric layer 18, a silicon oxycarbide layer 20, and a silicon oxynitride layer 22 are successively deposited on the substrate 10 above the conductive region 12. The silicon oxycarbide layer 20 is $Si_xO_yC_z$ (hereinafter merely referred to as "SiOC"), wherein x, y and z are optional integers which are each an optional integer standing for the atom composition ratio. The SiOC layer may have a thickness of about 150 angstroms to about 800 angstroms, which may be formed through any of a variety of techniques, including, CVD (chemical vapor deposition), e.g. LPCVD (low-pressure chemical vapor deposition), APCVD (atmospheric-pressure chemical vapor deposition), and PECVD (plasma-enhanced chemical vapor deposition), and future-developed deposition procedures. The SiOC layer 20 may have a extinction coefficient of about 0.3 to about 1.2, a density of about 1.9 gm/cm$^3$ to about 2.3 gm/cm$^3$, a C content of about 2% to about 10 atom %, and dielectric constant of about 3.9 to about 5 (Please revise and put the unit if necessary.). The silicon oxynitride layer 22 is $Si_xO_yN_z$ (hereinafter merely referred to as "SiON"), wherein x and z are optional integers which are each an optional integer standing for the atom composition ratio. In one embodiment, y is an optional integer standing for the atom composition ratio. In another embodiment, y is a zero. The silicon oxynitride layer 22 may have a thickness of about 150 angstroms to about 800 angstroms, which may be formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures. As appropriate to individual methods, the silicon oxynitride layer 22 may be in-situ or ex-situ upon the silicon oxycarbide layer 20.

One key feature of the present invention is to employ a combination of the SiON layer 22 and the SiOC layer 20, hereinafter merely referred to as a multilayer SiON/SiOC structure 21, as an ARC layer, which may have combination functions of preventing the low k dielectric material from the absorption of contaminating chemical species and the formation of the etching stop phenomenon during anisotropic etching. Another key feature of the present invention is to employ the multilayer SiON/SiOC structure 21 to lower an effective k value in the overall stack dielectrics. The thickness of the preferred embodiment of the a multilayer SiON/SiOC structure 21 may be about 600 angstroms to about 1200 angstroms The low-k dielectric layer 18 is preferably formed of a comparatively low dielectric constant dielectric material with a k value of less than about 3.9, e.g., 3.5 or less. A wide variety of low-k materials may be employed in accordance with embodiments of the present invention, for example, spin-on inorganic dielectrics, spin-on organic dielectrics, porous dielectric materials, organic polymer or organic silica glass. The organic polymer includes, for example, SiLK (manufactured by The Dow Chemical Co.™, k=2.7) or FLARE of a polyallyl ether (PAE) series material (manufactured by Honeywell Electronic Materials Co., k=2.8). The organic silica glass (SiOC series materials) includes, for example, HSG-R7 (manufactured by Hitachi Kasei Industry Co., k=2.8), Black Diamond (manufactured by Applied Materials Inc. in the U.S.A., k=3.0~2.4) or p-MTES (manufactured by Hitachi Kaihatsu, k=3.2) Other SiOC series materials may include, for example, CORAL (manufactured by Novellus Systems, Inc., in the U.S.A. k=2.7~2.4) and Aurora (manufactured by Nippon ASM Co., k=2.7). Further, FSG (SiOF series material), HSQ (hydrogen silsesquioxane, k=2.8~3.0) series material, MSQ (methyl silsesquioxane, k=2.5~2.7) series material, porous HSQ series material, porous MSQ material or porous organic series material may also be used. The low-k dielectric layer 18 may be formed to a thickness of about 1000 angstroms to about 20000 angstroms through any of a variety of techniques, including, spin coating, CVD, and future-developed deposition procedures.

Still referring to FIG. 1A, a photoresist layer 30 is next deposited over the structure 21 and exposed and developed according to a conventional photolithographic patterning process to form an anisotropic etching pattern for high aspect ratio via openings. Preferably, a deep ultraviolet chemically amplified (DUV) photoresist is used for patterning the via openings may include an activating radiation source with a wavelength of less than about 250 nm, for example, from about 193 nm to about 250 nm, to expose the photoresist layer 30. The photoresist layer 30 may be any conventional DUV photoresist layer including a multi-layered photoresist including, for example, a chemically amplified resist producing a photogenerated acid. There are several suitable commercially available DUV photoresists known in the art.

Figure 1B:
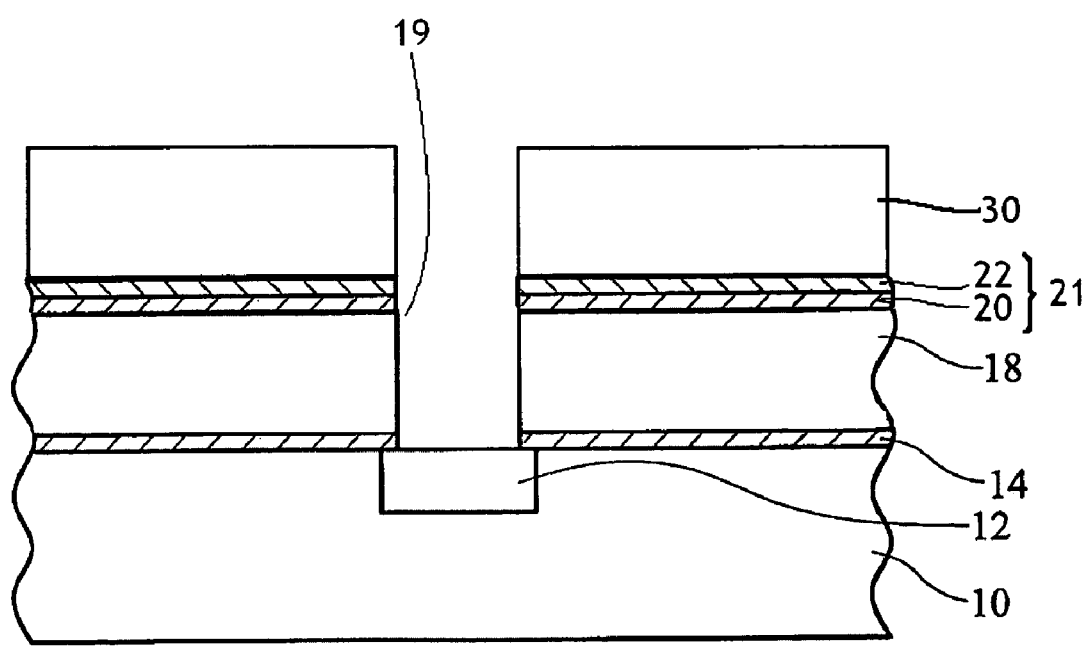

Referring to FIG. 1B, via opening 19 is anisotropically etched through the thickness of the structure 21, the Low-k dielectric layer 18, and the etch stop layer 14 to create via opening 19 in close communication with underlying conductive region 12. The anisotropic etching may be carried out by conventional plasma reactive ion etch (RIE) processes including for example, mixtures of hydro-fluorocarbons, fluorocarbons, oxygen, and nitrogen. The photoresist layer 30 is then typically removed by stripping procedures such as an oxygen plasma ashing.

Figure 1C:
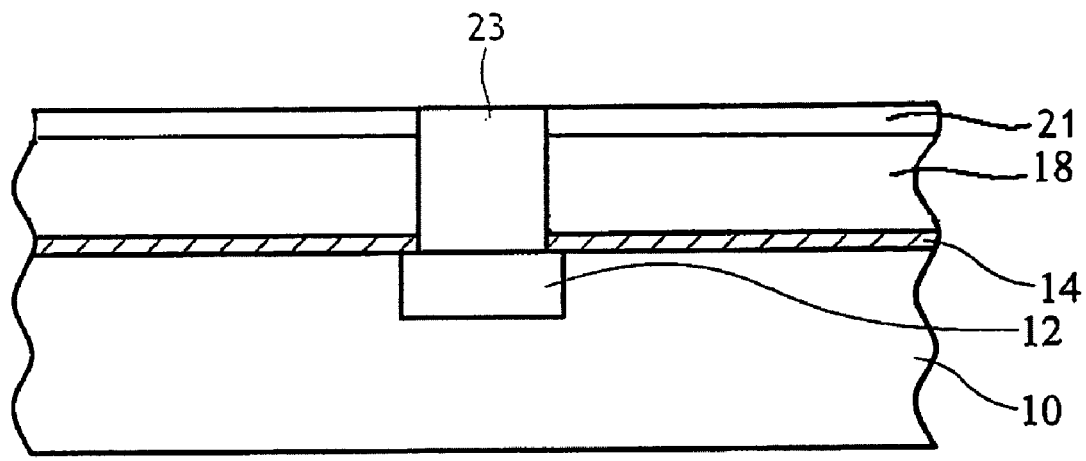

Referring to FIG. 1C, a conductive layer is formed on the substrate 10 by means of the electroplating method for example, thus filing the via hole 19 with the conductive layer 23. The conductive layer 23 extended over the structure 21 is removed by means of planarization (e.g. CMP) or etch back processes. In one embodiment, the structure 21 over the low-k dielectric layer 18 may be removed by means of planarization (e.g. CMP) or etch back processes. With respect to the via-fill conductive material, the conductive layer 23 may include a low resistivity conductor material selected from the group of conductor materials including, but not limited to, copper and copper-based alloy. For example, the via-fill conductive material may be formed employing the following process: (1) metal seed layer deposition with 50~2500 angstroms in thickness; (2) copper layer deposition with 5000~10000 angstroms in thickness. The metal seed layer may include copper, nickel, molybdenum, platinum, titanium, aluminum, or the combination thereof by means of PVD, CVD or atomic layer deposition (ALD) method.

Figure 1D:
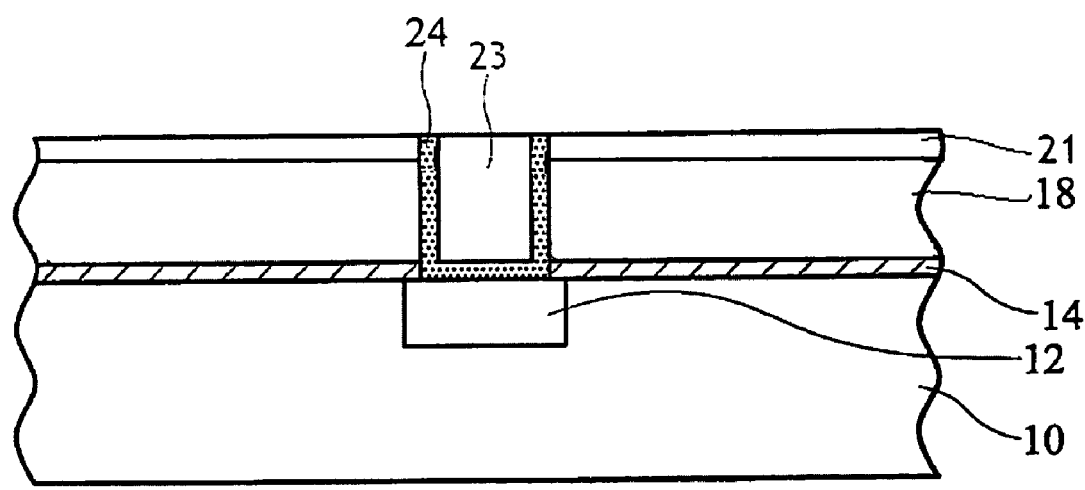

In one embodiment, a barrier layer may be further added to provide both an excellent diffusion barrier in combination with good conductivity. As depicted in FIG. 1D, a diffusion barrier layer 24 may be conformally deposited along the bottom and sidewalls of the via hole 19 prior to the via-fill conductive material process. The subsequent process for planarizing the conductive layer 23 also removes the diffusion barrier layer 24 extended on to the low-k dielectric layer 18. The diffusion barrier layer 24 may include, but not limited to, a refractory material, TiN, TaN, Ta, Ti, W, WN, Cr, Nb, mixtures thereof, or other materials that can inhibit diffusion of copper into the low-k dielectric layer 18 by means of PVD, CVD or ALD. The diffusion barrier layer 24 may have a thickness of about 50~300 angstroms.

Figure 2A:
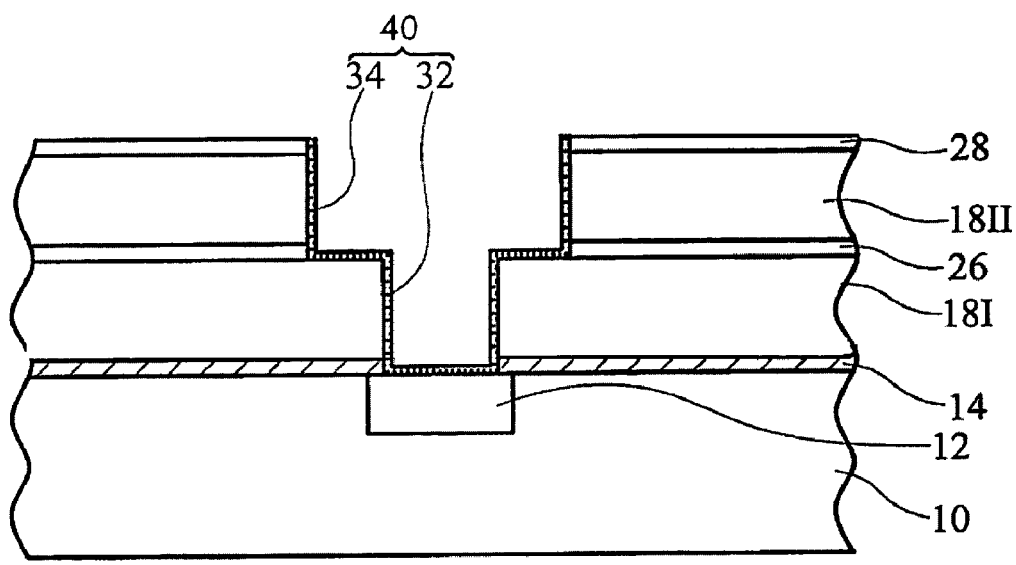
FIGS. 2A to 2B are cross-sectional diagrams illustrating a copper dual damascene process according to an embodiment of the present invention.
Figure 2B:
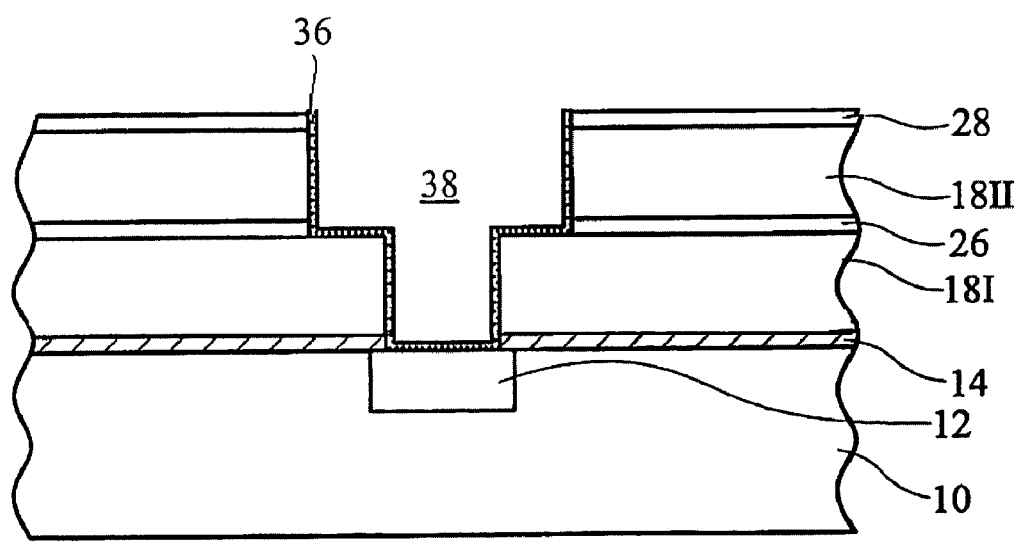

FIGS. 2A to 2B are cross-sectional diagrams illustrating a copper dual damascene process according to an embodiment of the present invention, wherein similar features or elements are denoted by similar reference numerals and explanation of the same or similar portions to the description in FIGS. 1A-1C will be omitted.

Referring to FIG. 2A, an example of a substrate 10 used for dual damascene fabrication is illustrated. Compared with the via hole 19 fabricated in the low-k dielectric layer 18 shown in FIG. 1B, FIG. 2A depicts the etch stop layer 14 laminated thereupon a first low-k dielectric layer 18I, a middle etch stop layer 26, a second low-k dielectric layer 18II, a multilayer SiOC/SiON layer 28 successively, wherein a dual damascene opening 40 including an upper trench section 34 and a lower via hole section 32 is defined to expose the conductive region 12. In implementing dual damascene techniques, a middle etch stop layer 26 may be deposited between the two low-k dielectric layers 18I and 18II. A photoresist mask (not shown) is then provided, and anisotropic etching is conducted to form a via hole through the multilayer SiOC/SiON layer 28, the second low-k dielectric layer 18II, the middle etch stop layer 26, the first low-k dielectric layer 18I and the etching stop structure 14. Subsequently, the photoresist mask for the via hole is removed, and then a photoresist mask for a trench is provided and anisotropic etching is conducted to form a trench through the multilayer SiOC/SiON layer 28, the second low-k dielectric layer 18II and the middle etch stop layer 26. It is understood that those skilled in the art and having reference to this specification will readily comprehend the manner in which the locations of the upper trench section 34 and the lower via section 32 may be defined in this dual damascene manner.

The middle etch stop layer 26 is chosen for its high selectivity with respect to the overlying second low-k dielectric layer 18II, and also functions as an anti-reflective coating (ARC). Suitable materials for the middle etch stop layer 26 having a thickness of about 200 angstroms to about 800 angstroms may include, but not limited to, silicon nitride, silicon oxynitride, silicon carbide, combinations thereof, or the like using CVD, PECVD, PVD, and future-developed deposition procedures. In an embodiment of the present invention, the middle etch stop layer 26 may be optionally omitted between the two low-k dielectric layers 18I and 18II.

Referring to FIG. 2B, a diffusion barrier layer 36 may be deposited on the substrate 10 to conformally cover the bottom and the sidewalls of the dual damascene opening 40 and extend on to the multilayer SiOC/SiON layer 28. A conductive layer 38 is then formed on the diffusion layer 36 to fill the dual damascene opening 40. Next, portions of the conductive layer 38 and the diffusion barrier layer 36 extended on to the multilayer SiOC/SiON layer 28 (Inventor: Can the SiOC and SiON also be a polish stop layer?) are removed and planarized by means of CMP or other suitable etch back processes. At this time, it is preferred that the CMP process palnarizes the conductive layer 38. In one embodiment, the structure 28 over the low-k dielectric layer 18I and 18II may also be removed by means of planarization (e.g. CMP) or etch back processes. The conductive layer 38 may under certain circumstances be formed employing methods, materials and thickness dimensions analogous or equivalent to the methods, materials and thickness dimensions as employed for forming the conductive layer 23 described in FIGS. 1C and 1D. Typically and preferably, the conductive layer 38 may include copper or copper-based alloy. The diffusion barrier layer 36 may under certain circumstances be formed employing methods, materials and thickness dimensions analogous or equivalent to the methods, materials and thickness dimensions as employed for forming the diffusion barrier layer 24 described in FIG. 1D. Typically and preferably, the diffusion barrier layer 36 may include a refractory material or other materials that can inhibit diffusion of copper into the low-k dielectric layers 18I and 18II.

Embodiments of the present invention, therefore, enable the fabrication of semiconductor device having copper interconnection patterns with feature sizes in the deep submicron regime with not only high circuit speed employing various low-k materials, but also with extremely high reliability. The present invention is particularly applicable to interconnect technology involving damascene techniques.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. An interconnect structure, comprising:
    a substrate comprising a conductive region;
    at least one low k dielectric layer having a dielectric constant less than 3.9 overlying the substrate;
    a multilayer silicon oxynitride/silicon oxycarbide structure overlying the low k dielectric layer; and
    a conductive layer inlaid the multilayer silicon oxynitride/silicon oxycarbide structure and the low k dielectric layer, wherein the conductive layer is electrically connected to the conductive region;
    wherein a lowest layer of the multilayer silicon oxynitride/silicon oxycarbide structure directly on the low k dielectric layer is a layer of silicon oxycarbide material comprising a carbon(C) content of about 2% to about 10 atom %.

2. The structure of claim 1, wherein the layer of silicon oxynitride material has a thickness of about 150 angstroms to about 800 angstroms.

3. The structure of claim 1, wherein the layer of conductive material comprises copper.

4. The structure of claim 1, wherein the layer of silicon oxycarbide material has a thickness of about 150 angstroms to about 800 angstroms.

5. The structure of claim 1, wherein a combination of the silicon oxycarbide layer and silicon oxynitride has a thickness of about 600 angstroms to about 1200 angstroms.

6. An interconnect structure, comprising:
    a substrate comprising a conductive region;
    at least one low k dielectric layer having a dielectric constant less than 3.9 overlying the substrate;
    a multilayer silicon oxynitride/silicon oxycarbide structure overlying the low k dielectric layer; and
    a conductive layer inlaid the multilayer silicon oxynitride/silicon oxycarbide structure and the low k dielectric layer, wherein the conductive layer is electrically connected to the conductive region;
    wherein a lowest layer of the multilayer silicon oxynitride/silicon oxycarbide structure directly on the low k dielectric layer is a layer of silicon oxycarbide material comprising an extinction coefficient k of about 0.3 to about 1.2.

7. An interconnect structure, comprising:
    a substrate comprising a conductive region;
    at least one low k dielectric layer having a dielectric constant less than 3.9 overlying the substrate;
    a multilayer silicon oxynitride/silicon oxycarbide structure overlying the low k dielectric layer; and
    a conductive layer inlaid the multilayer silicon oxynitride/silicon oxycarbide structure and the low k dielectric layer, wherein the conductive layer is electrically connected to the conductive region;
    wherein a lowest layer of the multilayer silicon oxynitride/silicon oxycarbide structure directly on the low k dielectric layer is a layer of silicon oxycarbide material comprising a density of about 1.9 $gm/cm^3$ to about 2.3 $gm/cm^3$.

* * * * *